US010203726B2

(12) United States Patent
Rho et al.

(10) Patent No.: US 10,203,726 B2
(45) Date of Patent: Feb. 12, 2019

(54) ROLLABLE DISPLAY DEVICE

(71) Applicant: AMOGREENTECH CO., LTD., Gyeonggi-do (KR)

(72) Inventors: Seung Yun Rho, Gyeonggi-do (KR); Won Gil Choi, Gyeonggi-do (KR); Hyeon Woo Cho, Chungcheongnam-do (KR); Ju Hee Jang, Gyeonggi-do (KR)

(73) Assignee: AMOGREENTECH CO., LTD., Gyeonggi-do (KR)

( * ) Notice: Subject to any disclaimer, the term of this patent is extended or adjusted under 35 U.S.C. 154(b) by 0 days.

(21) Appl. No.: 15/521,549

(22) PCT Filed: Oct. 23, 2015

(86) PCT No.: PCT/KR2015/011264
§ 371 (c)(1),
(2) Date: Apr. 24, 2017

(87) PCT Pub. No.: WO2016/064240
PCT Pub. Date: Apr. 28, 2016

(65) Prior Publication Data
US 2017/0329368 A1 Nov. 16, 2017

(30) Foreign Application Priority Data

Oct. 24, 2014 (KR) .................. 10-2014-0145528
Apr. 30, 2015 (KR) .................. 10-2015-0061746

(51) Int. Cl.
*G06F 1/16* (2006.01)
*G09F 9/30* (2006.01)
(Continued)

(52) U.S. Cl.
CPC .......... *G06F 1/1652* (2013.01); *G06F 1/1632* (2013.01); *G06F 1/1635* (2013.01);
(Continued)

(58) Field of Classification Search
CPC .............................. G06F 1/1652; G09F 9/301
(Continued)

(56) References Cited

U.S. PATENT DOCUMENTS 8,785,030 B2 * 7/2014 Ueda ................... H01M 10/052
429/127
8,929,085 B2 * 1/2015 Franklin ............... G06F 1/1626
361/749

(Continued)

FOREIGN PATENT DOCUMENTS

CN      203786602 U    8/2014
JP      2008-148721 A  7/2008
(Continued)

OTHER PUBLICATIONS

International Search Authority/KR, International Search Report dated Feb. 18, 2016 in International Patent Application No. PCT/KR2015/011264 (with English translation), 4 pages.

*Primary Examiner* — Christopher Mahoney
(74) *Attorney, Agent, or Firm* — Masuvalley & Partners

(57) ABSTRACT

A rollable display device is provided. An exemplary embodiment of the present invention provides a rollable display device including: a display body including a display unit configured to display various types of information as an image on one surface thereof and provided to be rollable; and a flexible battery provided on the display body and configured to supply power to the display body.

11 Claims, 10 Drawing Sheets

(51) Int. Cl.
*H04M 1/02* (2006.01)
*H01L 51/00* (2006.01)

(52) U.S. Cl.
CPC .......... *G09F 9/301* (2013.01); *H04M 1/0254* (2013.01); *H04M 1/0262* (2013.01); *H04M 1/0268* (2013.01); *G06F 2203/04102* (2013.01); *H01L 51/0097* (2013.01)

(58) Field of Classification Search
USPC .......................................... 359/461; 429/127
See application file for complete search history.

(56) References Cited

U.S. PATENT DOCUMENTS

| | | | |
|---|---|---|---|
| 2008/0303782 A1* | 12/2008 | Grant | G06F 1/1615 345/156 |
| 2009/0067123 A1 | 3/2009 | Huiteman et al. | |
| 2010/0311494 A1* | 12/2010 | Miller | A63F 1/18 463/22 |
| 2014/0002419 A1* | 1/2014 | Thorson | G06F 3/147 345/175 |
| 2015/0221244 A1* | 8/2015 | Miller | G09F 9/301 705/310 |
| 2017/0223312 A1* | 8/2017 | McNelley | H04N 7/15 |
| 2017/0288258 A1* | 10/2017 | Rho | H01M 10/0525 |

FOREIGN PATENT DOCUMENTS

| | | |
|---|---|---|
| KR | 10-2010-0041733 A | 4/2010 |
| KR | 10-2014-0076268 A | 6/2014 |
| WO | 2012/140709 A1 | 10/2012 |

\* cited by examiner

ROLLABLE DISPLAY DEVICE

TECHNICAL FIELD

The present invention relates to a rollable display device, and more particularly, to a rollable display device including a flexible battery included in a display body.

BACKGROUND ART

Recently, demand for mobile electronic devices, such as portable phones, notebooks, and digital cameras, is continuously increasing, and particularly, interest in flexible mobile electronic devices, to which scrollable displays, flexible electronic paper (e-paper), flexible liquid crystal displays (flexible-LCDs), flexible organic light-emitting diodes (OLEDs), and the like are applied, is increasing. Accordingly, a power supply device having a flexible property is also required for the flexible mobile electronic device.

A flexible battery has been developed as one of power supply devices having such a property. For example, a pouch-type battery, in which an electrolyte input and sealed in a pouch including two electrodes and a separator is used, has been developed.

Such a pouch-type battery has advantages in that the pouch-type battery can be manufactured in various shapes because of being made of flexible materials, and high energy density per mass can be achieved. However, when the pouch-type battery is excessively bent or twisted, an excessive load can be applied to an embedded electrode assembly. Thus, there is a problem in that the electrode assembly is broken and thus cannot serve as a battery due to such a load.

In addition, when the pouch-type battery is penetrated by a sharp tool, such as a needle or gimlet, or an edge of various objects, since there is no method to protect the pouch-type battery therefrom, there is a problem in that the electrode assembly embedded in the pouch-type battery is damaged and thus the pouch-type battery cannot perform functions thereof.

DISCLOSURE

Technical Problem

The present invention is directed to providing a rollable display device in which the same patterns are formed on an exterior material and an electrode assembly of a flexible battery, and thus performance of a battery may be prevented from being degraded even when the display is rolled.

In addition, the present invention is also directed to providing a rollable display device in which a supporting member is disposed on at least one surface of a flexible battery, thus a display and the flexible battery may be prevented from being twisted and thus may be prevented from being excessively deformed, and the flexible battery may be prevented from being penetrated and thus may be prevented from being broken.

In addition, the present invention is also directed to providing a rollable display device in which a supporting member and a flexible battery are covered by a fabric layer including a silver nanomaterial, and thus may provide a beneficial effect to a human body and block electromagnetic waves.

Technical Solution

One aspect of the present invention provides a rollable display device including: a display body including a display unit configured to display various types of information as an image on one surface thereof and provided to be rollable; and a flexible battery provided on the display body and configured to supply power to the display body.

In addition, a supporting member, which is formed in a plate shape and configured to prevent the flexible battery when the display body is rolled and the display body from being twisted and to prevent the flexible battery from being penetrated, may be disposed on at least one surface of the flexible battery, and the supporting member and the flexible battery may be wrapped and integrated by a wire material including a silver (Ag) nano-component.

In addition, the flexible battery may include an electrode assembly including a positive electrode, a negative electrode, and a separator and an exterior material configured to encapsulate the electrode assembly together with an electrolyte; and in which the electrode assembly and the exterior material are formed such that patterns for shrinkage and relaxation have the same directivity when the exterior material and the electrode assembly are rolled and the patterns may be disposed to be coincident with each other.

Advantageous Effects

According to the present invention, since the same patterns are formed on exterior materials and an electrode assembly of a flexible battery, the performance of a battery can be prevented from being degraded even when the display is rolled, and since a supporting member prevents a display body and the flexible battery from being twisted, the display body and the flexible battery can be prevented from being excessively deformed and thus can be prevented from being broken.

In addition, since a flexible battery according to the present invention is protected by a supporting member formed with a plate member, the flexible battery is prevented from being penetrated, and thus the flexible battery is prevented from being broken due to the penetration, and since the supporting member and the flexible battery are covered by a fabric layer including a silver nanomaterial, a beneficial effect can be provided to a human body, and electromagnetic waves can be blocked.

DESCRIPTION OF DRAWINGS

FIGS. 1A and 1B are views illustrating a rollable display device according to one embodiment of the present invention, wherein FIG. 1A is a view illustrating a state in which the rollable display device is rolled, and FIG. 1B is a view illustrating a state in which the rollable display device is unrolled.

FIGS. 2A and 2B are views illustrating a rollable display device according to another embodiment of the present invention, wherein FIG. 2A is a view illustrating a state in which the rollable display device is rolled, and FIG. 2B is a view illustrating a state in which the rollable display device is unrolled.

FIG. 21A and FIG. 21B are graphs showing the performance of the flexible battery applied to the rollable display device according to the present invention, wherein FIG. 21A is a graph showing changes of capabilities of batteries before and after bending, and FIG. 21B is a graph showing voltage changes of the batteries according to time when a momentary external force is applied to folded portions.

MODES OF THE INVENTION

Figure 1A:
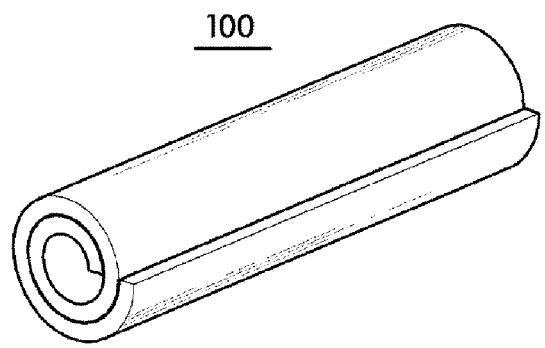

Hereinafter, embodiments of the present invention that may be easily performed by those skilled in the art will be described in detail with reference to the accompanying drawings. However, the embodiments of the present invention may be implemented in several different forms, and are not limited to the embodiments described herein. In addition, parts irrelevant to the description are omitted in the drawings in order to clearly explain the embodiments of the present invention. Similar parts are denoted by similar reference numerals throughout this specification.

As illustrated in FIGS. 1 to 4, a rollable display device 100 or 200 according to one embodiment of the present invention includes a display body 110 or 210 and a flexible battery 120 or 220.

The display body 110 or 210 is for displaying various types of information, such as characters, numbers, figures, or various pictures, as an image and includes an organic light emitting device (OLED) for displaying the various types of information as an image and a display unit 111 for displaying the various types of information as an image provided on one surface thereof. For example, the display body 110 or 210 may be a light transmissive or light reflective display and may include a plurality of pixels. Here, each of the pixels includes one or more light emitting elements, and the pixel may include an organic material, an inorganic material, or a combination of the organic and inorganic materials.

In addition, the display body 110 or 210 may include a known flexible liquid crystal display (LCD) or electroluminescent display. For example, a flexible OLED backlight may be used to illuminate a flexible LCD to provide a flexible backlit LCD.

In this case, the display body 110 or 210 includes a substrate (not shown) on which the light emitting element is mounted, and the display body 110 or 210 including the substrate may be made of a flexible material. That is, the display body 110 or 210 may have a structure in which thin film transistors and light emitting devices for implementing an image, an encapsulating layer configured to cover and protect the thin film transistors and the light emitting elements, and the like are stacked on the flexible substrate. Accordingly, a total size of the display body 110 or 210 can be decreased by rolling the display body 110 or 210 when not used, and thus the display body 110 or 210 can be easily carried and stored.

Since information about such a display body is known, a detail description thereof will be omitted, and any shape, in addition to the above-described structure, may be used as the display body as long as a structure thereof is flexible and is capable of being rolled, and the display body may also be implemented as an electrostatic or piezoelectric touch screen.

Figure 1B:
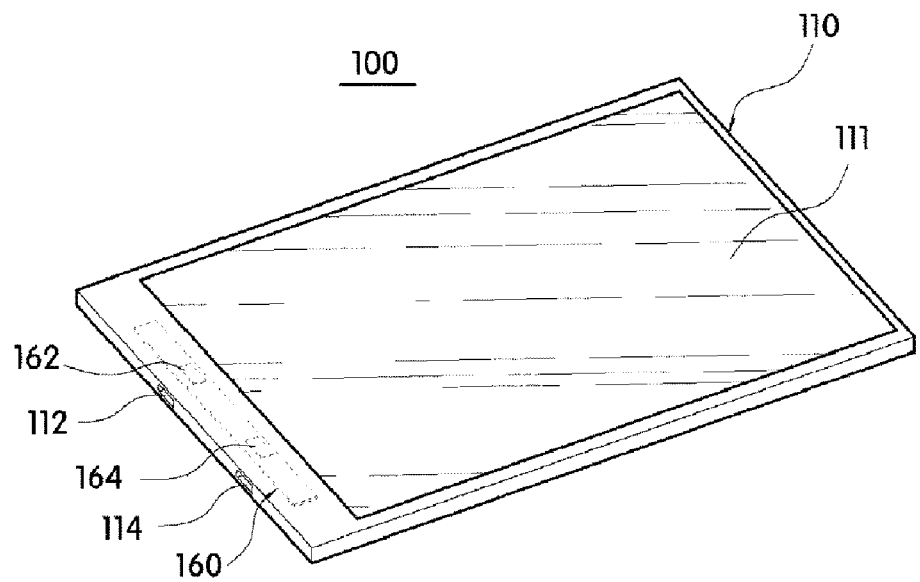

Meanwhile, as illustrated in FIG. 1B, at least one terminal 112 connected to an external device may be provided on one side of the display body 110. Here, the terminal 112 may be provided in a pair of positive and negative electrodes or also be provided as the known Universal Serial Bus (USB) in which positive and negative electrodes are integrated. In addition, the terminal 112 may be directly connected to a pair of electrode terminals 138 and 139 which protrude from the flexible battery 120 or 220 or may also be electrically connected to the electrode terminals 138 and 139 through a separate connection terminal. Accordingly, the display body 110 may be connected to an electronic device, such as a smart phone or a digital camera, a memory card, and the like through the terminal 112 and may receive various types of information stored in the electronic device or the memory card, and may thus display the various types of information on the display unit 111.

Here, the terminal 112 is electrically connected to a circuit unit 160 embedded in the display body 110, and the circuit unit 160 is electrically connected to the flexible battery 120 or 220. That is, the display body 110 is operated by power supplied from the flexible battery 120 or 220, and thus various types of information may be displayed on the display unit 111.

In this case, a separate charging terminal 114 for directly recharging the flexible battery 120 or 220 may be provided on one side of the display body 110. That is, the charging terminal 114 is connected to a known charging cable, is electrically connected to a separate external charging device through the charging cable, and may thus recharge the flexible battery 120 or 220 with power supplied from the charging device when some or all of the power of the flexible battery 120 or 220 is consumed. Here, the charging terminal 114 is electrically connected to the circuit unit 160. In addition, the terminal 112 and the charging terminal 114 may be provided in an integrated single type and thus may also simultaneously perform a function of a bridge portion configured to transmit or receive data and to recharge the flexible battery 120 or 220.

In addition, a separate switch configured to turn on or off the operation of the display body 110 or 210 may be provided on one side of the display body 110 or 210, and various buttons for operating the display body 110 or 210 may also be provided on one side of the display body 110 or 210. In addition, a speaker for emitting sound to the outside when a video is reproduced through the display body 110 or 210 and a microphone for storing sounds from the outside may also be provided on the display body 110 or 210.

Figure 2A:
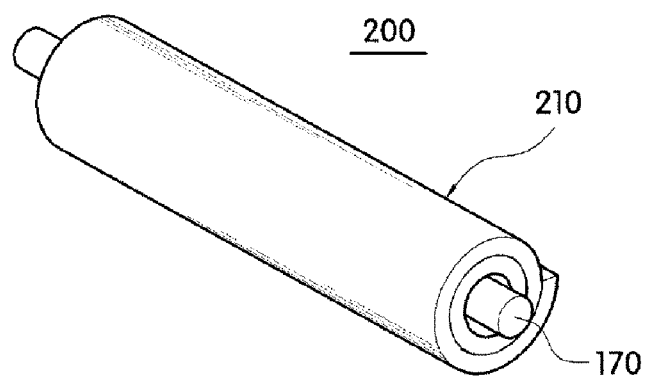
Figure 2B:
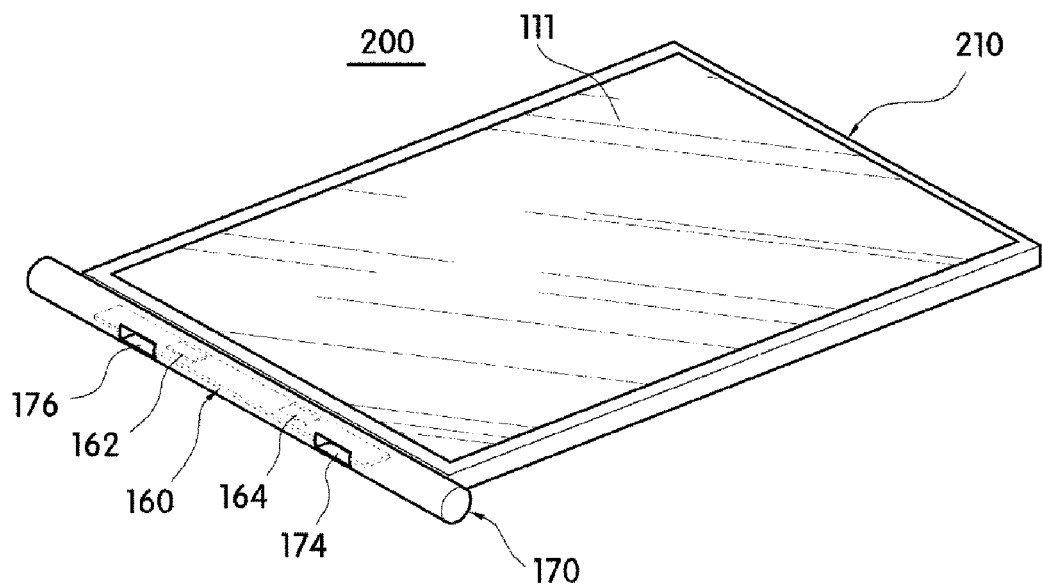

Meanwhile, the circuit unit 160 may be embedded in the display body 110 (see FIG. 1B) or in a support bar 170 (see FIG. 2B). Such a circuit unit 160 may include a driving circuit 162 for driving the display body 110 or 210 and a communication circuit 164 for wired and wireless communication with an external device.

For example, the circuit unit 160 provides the performance for analog and digital wireless signal processing, includes any number of signal processing techniques including data encryption, and may thus provide secure communication, such as interference from third parties and noise attenuation, background noise cancellation, echo cancellation, and sound quality enhancement, which is safe from the other techniques. In addition, the circuit unit 160 may provide mixed wireless performance and may transmit/receive or process an infrared signal in a short range or a radio frequency signal in a middle range and a long range according to characteristics of an external device. Such wireless performance may be implemented by software. In addition, the circuit unit 160 may include a controller configured to selectively or complexly control communication signals including audio, video and/or control data. Here, the circuit unit 160 may include a controller configured to selectively perform or simultaneously control display or storage of audio, video and/or control data received by or input to the display body 110 or 210. In addition, the circuit unit 160 may include a wireless transceiver such as an antenna configured to transmit an output wireless signal and to receive an input wireless signal. Here, the wireless signal may be an analog or digital wireless signal.

Here, the circuit unit 160 is illustrated and described as being separately provided in the display body, but the present invention is not limited thereto, and the circuit unit may be mounted on a substrate embedded in the display body.

Figure 3:
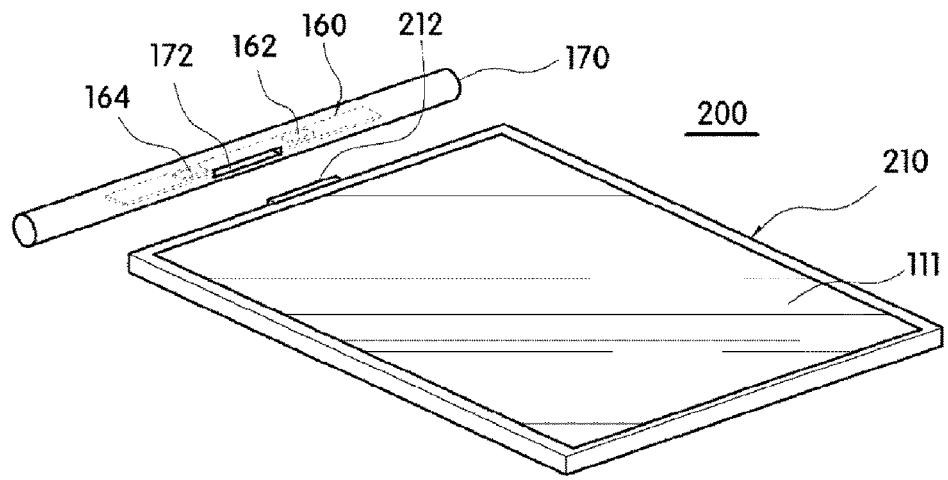
FIG. 3 is an exploded view illustrating the rollable display device of FIG. 2B.

Meanwhile, as illustrated in FIGS. 2 and 3, the display device 200 according to the present invention may include a support bar 170 around which the display body 210 is wound. Here, the support bar 170 may be formed in a bar shape having a predetermined length and formed in a cylindrical shape so that the display body 210 is not damaged when rolled.

In this case, an accommodation groove 172 may be provided in one side of the support bar 170 so that a terminal 212 which protrudes from the display body 210 is inserted thereinto. Accordingly, the display body 210 may be wound along an outer surface of the support bar 170 in a state in which the terminal 212 is inserted into the accommodation groove 172, and the support bar 170 and the display body 210 are coupled. Here, when the support bar 170 is provided on one side of the display body 210, the circuit unit 160 may be embedded in the display body 210 (see FIG. 1B), or may also be embedded in the support bar 170 (see FIGS. 2B and 3).

In this case, the accommodation groove 172 is provided in a connection terminal form configured to electrically connect the terminal 212 to the circuit unit 160 when the terminal 212 is inserted into the accommodation groove 172, and the terminal 212 performs a role of a connection terminal for electrically connecting the flexible battery 120 or 220 and the display body 210 to the circuit unit 160. Accordingly, a signal is transmitted from the circuit unit 160 to the display body through the terminal 212, and thus the display body 210 is operated using power supplied from the flexible battery 120 or 220.

Meanwhile, when the circuit unit 160 is embedded in the support bar 170, a connection terminal 176 for connecting to an external device may be provided on one side of the support bar 170. Here, the connection terminal 176 may be provided in a pair of positive and negative electrodes or may also be provided as an USB in which positive and negative electrodes are integrated. Such a connection terminal 176 is connected to an electronic device, such as a smart phone or a digital camera, a memory card, and the like, and thus performs the role of a data transmission path to display various types of information stored in the electronic device or the memory card on the display unit 111.

In addition, a separate charging terminal 174 for directly recharging the flexible battery 120 or 220 may be provided on one side of the support bar 170. That is, the charging terminal 174 may be connected to a separate charging device for charging the flexible battery 120 or 220 when some or all of the power of the flexible battery 120 or 220 is consumed. Here, the charging terminal 174 may be directly connected to the charging device or may also be connected to the charging device through a charging cable as an intermediary. Thus, power supplied through the charging terminal 174 is supplied to the flexible battery 120 or 220 through the circuit unit 160 and the terminal 212, and thus the flexible battery 120 or 220 is recharged.

Here, the charging terminal 174 is also electrically connected to the circuit unit 160 embedded in the support bar 170 and the operation thereof is controlled through the circuit unit 160.

The flexible battery 120 or 220 is for supplying the display body 110 or 210 with power, is provided in a plate shape having a predetermined area, and may be embedded in the display body 110 or 210, or may be attached to one surface of the display body 110 or 210 through a separate member.

As described above, the rollable display device 100 or 200 according to the present invention includes the flexible battery 120 or 220 configured to supply power to the display body 110 or 210, and thus the display body 110 or 210 is operated using the power supplied by the flexible battery 120 or 220.

Here, the flexible battery 120 or 220 may be used as a driving power source for driving the display body 110 or 210 or may also be used as an auxiliary battery configured to assist a main battery included in the display body 110 or 210.

In this case, the flexible battery 120 or 220 is provided in a flexible form capable of being rolled together with the display body 110 or 210 when the display body 110 or 210 is rolled. That is, the flexible battery 120 or 220 is provided in a form capable of being rolled like the display body 110 or 210, and thus the rollable display device 100 or 200 may be provided to have approximately the same wide area as the display body. Accordingly, since the flexible battery 120 or 220 has the wide area corresponding to the area of the display body, a high capacity battery can be implemented, and thus the use time of the display body 110 or 210 can be increased.

To this end, the flexible battery 120 or 220 includes an electrode assembly 130 and exterior materials 121 and 122, and the electrode assembly 130, together with an electrolyte, is encapsulated in the exterior materials 121 and 122. In this case, the exterior materials 121 and 122 and the electrode assembly 130 include patterns 126 and 137 for shrinkage and relaxation in a longitudinal direction when rolled, and first patterns 126 formed on the exterior materials 121 and 122 and a second pattern 139 formed on the electrode assembly 130 are provided to have the same directivity (see FIGS. 5 and 6).

The above-described patterns 126 and 137 offset a changed length generated by a change of curvature at a bent portion when the flexible battery 120 or 220 is rolled, and thus shrinkage or relaxation of a base material itself is prevented or minimized. Thus, since a deformation amount of the base material itself forming the exterior materials 121 and 122 and the electrode assembly 130 is prevented or minimized, a deformation amount of base material itself locally generated at a portion at which the base material is bent is prevented or minimized even when the base material is repeatedly bent or curved while being used, and thus the exterior materials 121 and 122 and the electrode assembly 130 are prevented from being locally broken or the performance thereof is prevented from being lowered when rolled.

In this case, the first patterns 126 and the second pattern 137 are disposed to have the same directivity and the first patterns 126 and the second pattern 137 are also disposed to coincide with each other. The reason is to allow the first patterns 126 and the second pattern 137 to always behave equally, thereby enabling the first pattern 126 and the second pattern 137 to always maintain initial states thereof even though a rolled state is changed to an unrolled state or a flat plate state is changed to a rolled state.

Figure 21A:
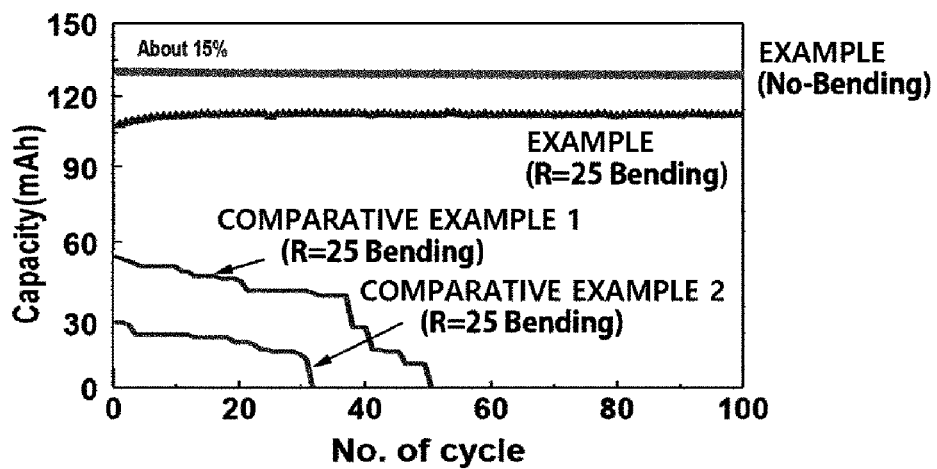
Figure 21B:
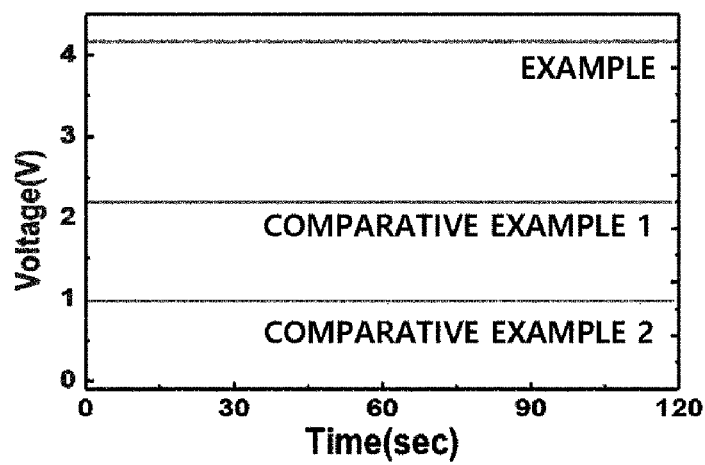

These performance may be seen from graphs of FIGS. 21A and 21B.

That is, as illustrated in FIG. 21A, it can be seen that under an environment with a temperature of 25° C. and humidity of 65%, when the flexible battery is bent by applying force to both end portions of the flexible battery so that a curvature of a bent portion is 25 mm and the flexible battery is charged and discharged 100 times, the flexible battery 120 or 220 according to the present invention has a capacity (110 mAh), which is reduced by about 15% in comparison with a capacity (130 mAh) when the flexible battery is not bent, and maintains performance even though the charge and the discharge are carried out 100 times (Exemplary Embodiment), but a flexible battery having the patterns for shrinkage and relaxation formed only on the exterior material has a capacity (52 mAh) reduced by about 60% in comparison with an initial capacity, has performance being slowly decreased, and cannot be charged and discharged when the number of times the flexible battery is charged and discharged exceeds 50 (Comparative Example 1), and a flexible battery, which is provided in the form of a simple plate without having a pattern formed on the exterior material and the electrode assembly, has a capacity (26 mAh) reduced by about 80% in comparison with an initial capacity, and cannot be charged and discharged when the number of times the flexible battery is charged and discharged exceeds 30 (Comparative Example 2).

Meanwhile, as illustrated in FIG. 21B, it can be seen that as a result of measuring voltage of the battery with respect to time after the flexible battery returns back to the original state from the state in which an intermediate portion in the longitudinal direction of the flexible battery is completely folded, under an environment with a temperature of 25° C. and humidity of 65%, the flexible battery 120 or 220 according to the present invention does not show a change in voltage value (Exemplary Embodiment), but the flexible battery (Comparative Example 1) having the patterns for shrinkage and relaxation formed only on the exterior material and the flexible battery (Comparative Example 2), which is provided in the form of a simple plate without having a pattern formed the exterior material and the electrode assembly, show deterioration in voltage value.

In other words, it can be seen that in a case in which the patterns 126 and 137 for shrinkage and relaxation are formed on the exterior material 121 and 122 and the electrode assembly 130 so as to be coincident with each other, performance does not greatly deteriorate even though the flexible battery is bent, but in a case in which the pattern is formed only on the exterior material or neither the exterior material nor the electrode assembly has the pattern, a crack occurs or the electrolyte is leaked due to the bending of the flexible battery, such that performance of the battery is lowered.

As described above, since the flexible battery 120 or 220 applied to the present invention is formed such that the patterns 126 and 137 for shrinkage and relaxation in a longitudinal direction of the exterior materials 121 and 122 and the electrode assembly 130 are formed to be coincident with each other when rolled, the electrode assembly 130 and the exterior materials 121 and 122 always maintain a uniform gap or a contact state over the loverall length even though the flexible battery is bent by rolling, an electrolyte encapsulated together with the electrode assembly 130 is uniformly distributed over the overall length, and thus the performance as a battery can be prevented from being decreased.

To this end, peak portions and valley portions of the first patterns 126 and the second pattern 137 are formed in a direction parallel to a width direction of the exterior materials 121 and 122 and the electrode assembly 130, and the peak portions and the valley portions are alternately disposed in a longitudinal direction of the exterior materials 121 and 122 and electrode assembly 130. In addition, as the peak portions and the valley portions forming the first patterns 126 and the second pattern 137 are formed such that the peak portions of the first patterns 126 are disposed at the same location as the peak portions of the second pattern 137 and the valley portions of the first patterns 126 are disposed at the same location as the peak portions of the second pattern 137, the first patterns 126 and the second pattern 137 are matched with each other.

Figure 5:
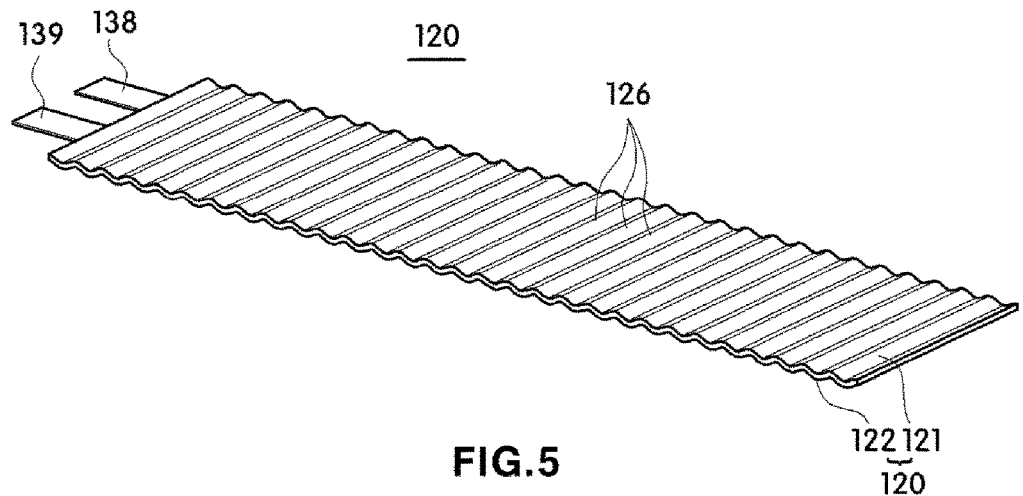
FIG. 5 is a view illustrating a flexible battery applied to the rollable display device according to the present invention.
Figure 6:
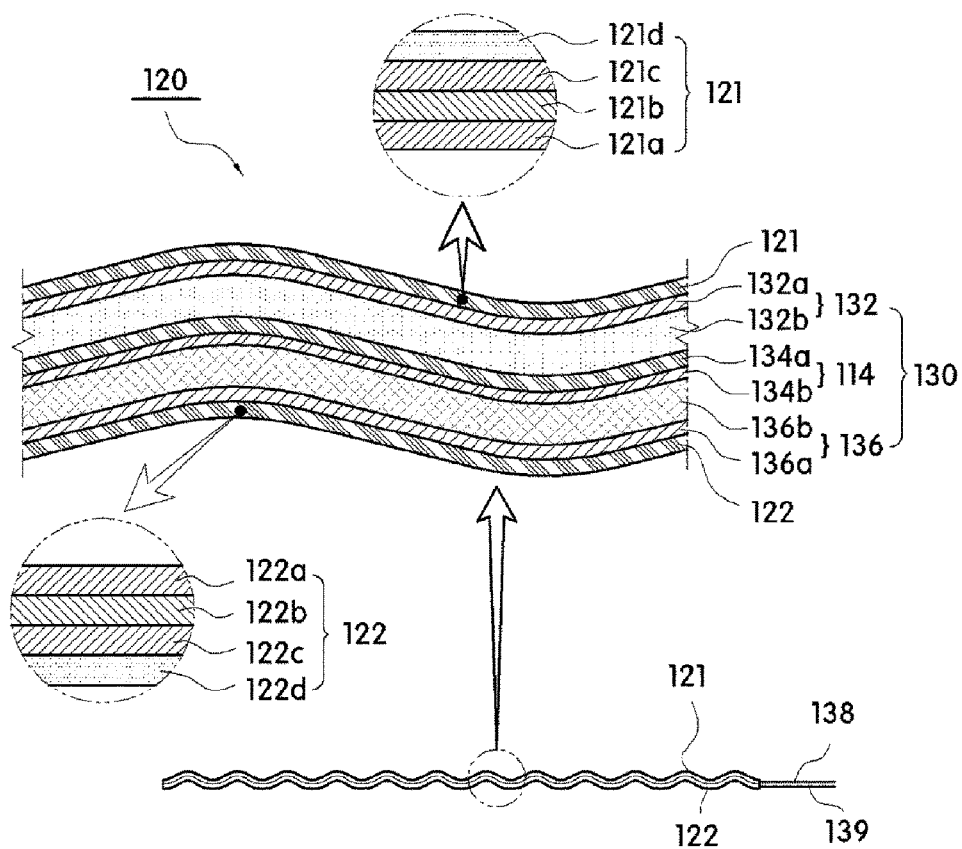
FIG. 6 is an enlarged view illustrating a detailed structure of the flexible battery applied to the rollable display device according to the present invention.

Specifically, the peak portions and the valley portions of the first patterns 126 and the second pattern 137 are formed in a direction parallel to a line parallel to a width direction of the exterior materials 121 and 122 and the electrode assembly 130, and the peak portions and the valley portions are repeatedly disposed in a longitudinal direction thereof (see FIGS. 5 and 6). In this case, the patterns 126 and 137 may be continuously or also discontinuously formed in a direction parallel to the width direction of the electrode assembly 130 and the exterior materials 121 and 122 (see FIG. 13), and may be formed over the overall length of the electrode assembly 130 and the exterior materials 121 and 122 or may be partially formed over a partial length thereof (see FIG. 14). Here, each of the peak portions and valley portions may be formed to have a cross section having an arc shape including a semicircle, a polygonal shape including a triangle or rectangle, or various shapes in which polygonal and arc cross sections are mixed, and the peak portions and the valley portion may be formed to have the same pitch and width, but may also be formed to have different pitches and widths (see FIGS. 15 to 18). Thus, even though shrinkage and relaxation of the exterior materials 121 and 122 and the electrode assembly 130 repeatedly occurs in a longitudinal direction by bending, a change amount of shrinkage and relaxation is offset by the patterns 126 and 137, and thus fatigue applied to the base material itself can be reduced.

Figure 13:
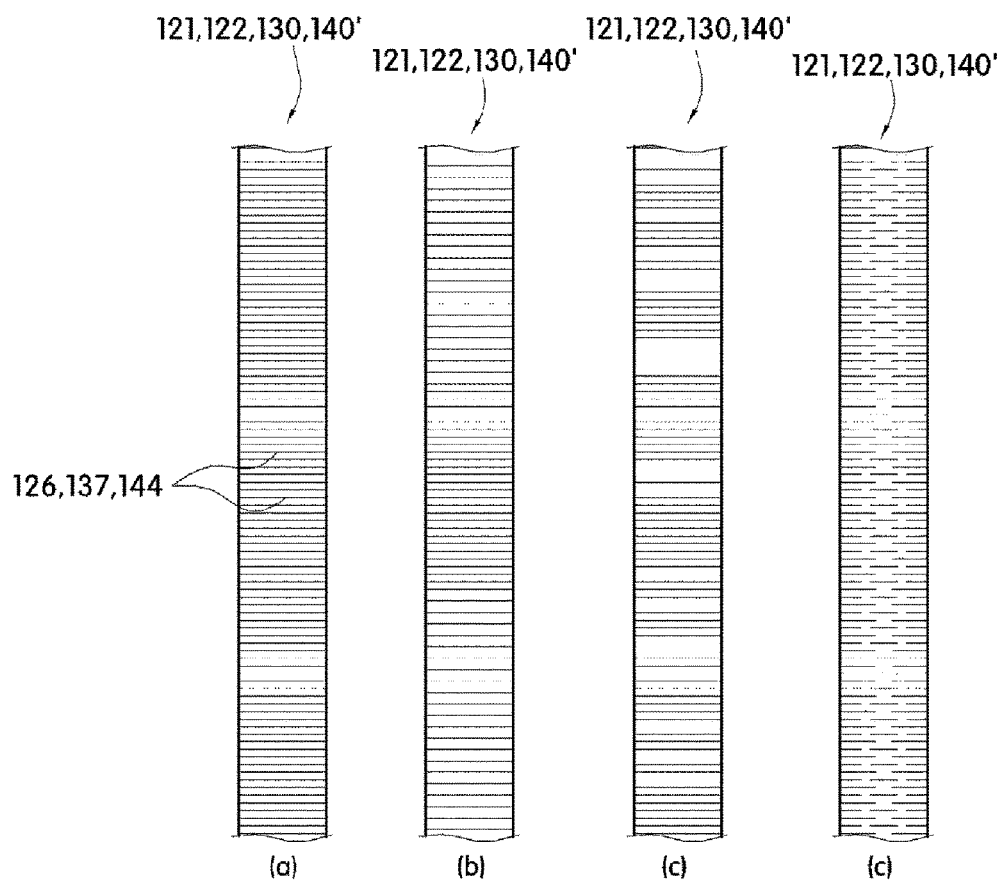
FIG. 13 is a schematic view illustrating various shapes of a pattern formed on the flexible battery and the supporting member applied to the rollable display device according to the present invention.
Figure 14:
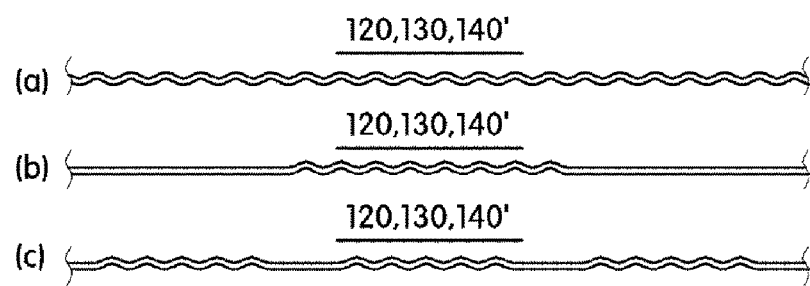
FIG. 14 is an exemplary view illustrating various patterns formed on the flexible battery and the supporting member applied to the rollable display device according to the present invention when the patterns are continuously or discontinuously formed in an entire length thereof.
Figure 15:
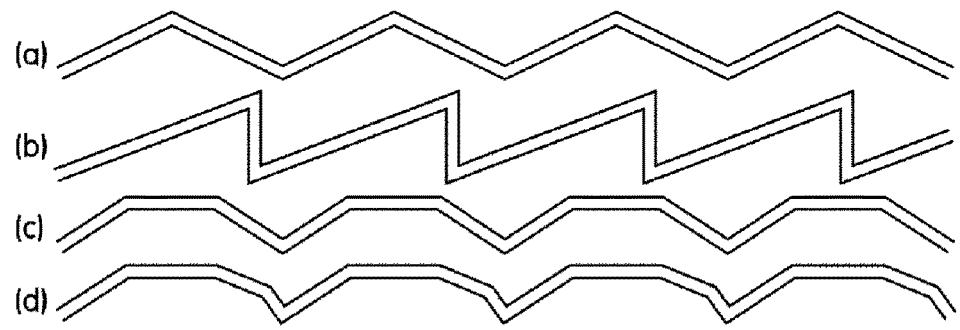
FIGS. 15 to 18 are schematic views illustrating various shapes of patterns formed on the flexible battery applied to the rollable display device according to the present invention.
Figure 16:
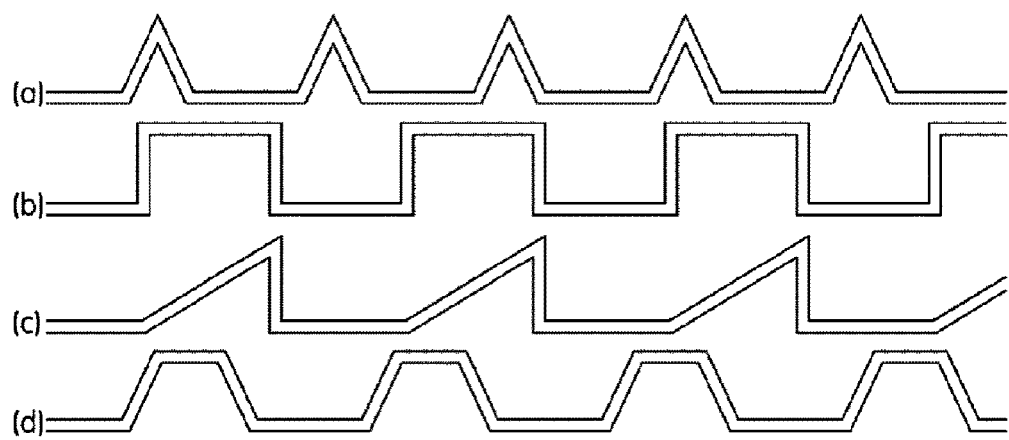
Figure 17:
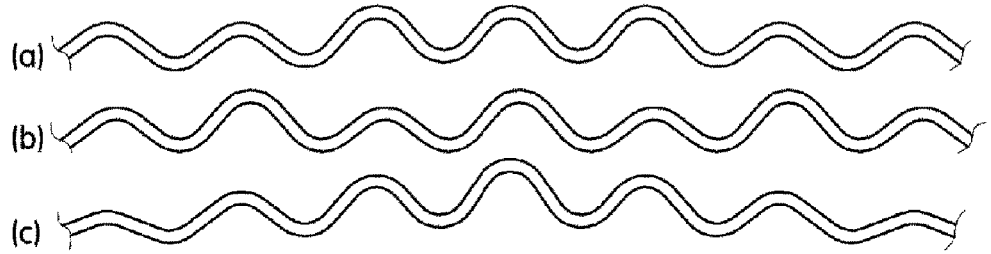
Figure 18:
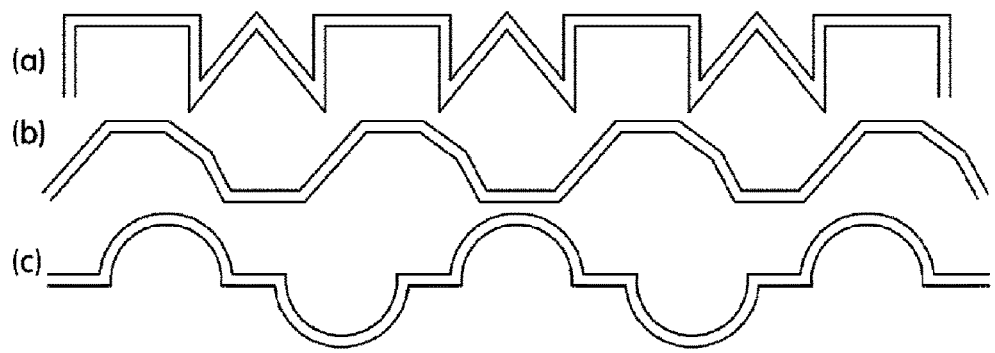

Meanwhile, as illustrated in FIG. 13, the first patterns 126 and the second pattern 137 may be formed such that intervals between the adjacent peak portions or adjacent valley portions are the same or different from each other, or the same interval and the different intervals are mixed. In addition, the first patterns 126 formed on the exterior materials 121 and 122 may be formed on entire surfaces of the exterior materials 121 and 122, or may also be partially formed thereon. For example, in the flexible battery 120 or 220, the first patterns 126 may also be formed only in an accommodation portion 123 for accommodating the electrode assembly 130 and an electrolyte.

The exterior materials 121 and 122 are formed of a plate member having a predetermined area, and accommodate therein the electrode assembly 130 and an electrolyte, thereby protecting the electrode assembly 130 from an external force.

To this end, the exterior materials 121 and 122 include a pair of the first exterior material 121 and the second exterior material 122, and are sealed by an adhesive along an edge thereof, thereby preventing the electrolyte and the electrode assembly 130 accommodated in the exterior material from being exposed and leaking to the outside.

That is, the first exterior material 121 and the second exterior material 122 include a first region which defines an accommodation portion 123 for accommodating the electrode assembly and an electrolyte, and a second region which defines a sealing portion 124 which is disposed to surround the first region and prevents the electrolyte from leaking to the outside.

In the case of the exterior material 121 and 122, the first exterior material 121 and the second exterior material 122 may be formed as two members, and then both rims of the first exterior material 121 and the second exterior material 122, which constitute the sealing portion, may be sealed by an adhesive, or the first exterior material 121 and the second exterior material 122 may be formed in one piece, and folded in half in a width direction or longitudinal direction, and then the remaining portions, which face each other, may be sealed by an adhesive.

Such an exterior material 121 or 122 may be formed to have a structure in which a metal layer 121b or 122b is interposed between a first resin layer 121a or 122a and a second resin layer 121c or 122c. That is, the exterior material 121 or 122 may be formed in the structure in which the first resin layer 121a or 122a, the metal layer 121b or 122b, and the second resin layer 121c or 122c are sequentially stacked, the first resin layer 121a or 122a is disposed at an inner side thereof to be in contact with an electrolyte, and the second resin layer 121c or 122c is exposed to the outside.

Meanwhile, the flexible battery 120 or 220 according to the present invention may further include an adhesion layer between the metal layer 121b or 122b and the first resin layer 121a or 122a, and a dry lamination layer between the metal layer 121b or 122b and the second resin layer 121c or 122c.

Figure 7:
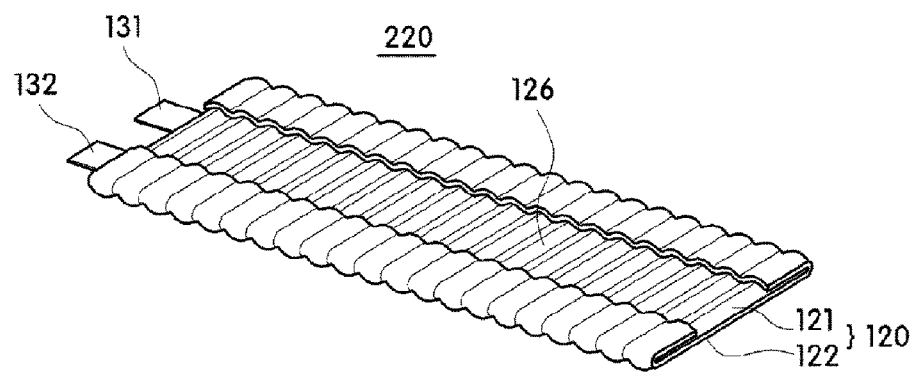
FIG. 7 is a view illustrating another type of the flexible battery applied to the rollable display device according to the present invention.
Figure 8:
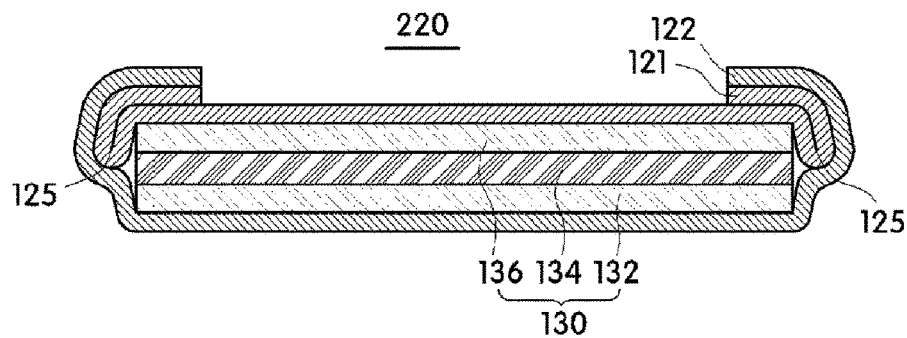
FIG. 8 is a schematic view for explaining a location of a fold line of FIG. 7.
Figure 9:
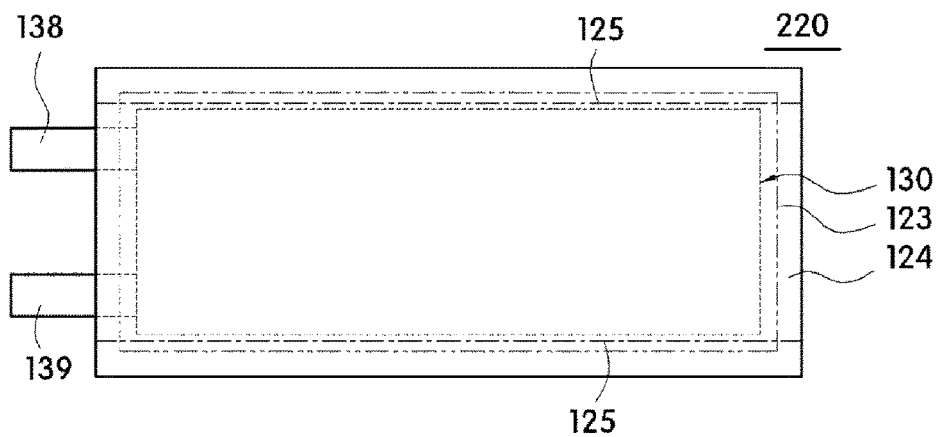
FIG. 9 is a cross-sectional view illustrating the flexible battery of FIG. 7.

Meanwhile, in the flexible battery 220 applied to the present invention, both side ends thereof including the sealing portion 124 are folded toward an upper surface side or a lower surface side of the accommodation portion 123 via fold lines 125 as an intermediary, which are disposed in a direction parallel to a longitudinal direction, and thus an unnecessary region excluding the accommodation portion 123 in which an electrolyte and electrode assembly 130 are accommodated is minimized (see FIGS. 7 to 9). Here, the fold lines 125 are disposed in parallel to at least one of longitudinal and width directions of the exterior materials 121 and 122. Thus, in the flexible battery 220 applied to the present invention, since a width of the sealing portion 124 which protrudes from the accommodation portion 123 toward the outside is decreased as much as a width by which the exterior material is folded toward the upper or lower surface thereof, the width of sealing portion which protrudes from the accommodation portion in a width direction is minimized, a dead space is decreased, and thus an area of the accommodation portion 123 can be relatively increased.

Accordingly, although an entire area of the flexible battery 220 is the same, a size of the electrode assembly 130 may be increased by an area corresponding to an area of the expanded accommodation portion 123, and thus the flexible battery having a relatively high capacity can be implemented while maintaining the same size.

Meanwhile, although a partial width of the sealing portion 124 may be folded by the fold lines 125 disposed on the sealing portion 124, the fold lines 125 are disposed such that at least one part thereof is inwardly spaced a predetermined distance from an edge of the accommodation portion 123 (see FIG. 9). In other words, the fold lines 125 are inwardly spaced a predetermined distance from a boundary of the accommodation portion 123 and the sealing portion 124. More specifically, the fold lines 125 are disposed to be located in a region between a side end of the electrode assembly 130 accommodated in the accommodation portion 123 and the boundary which divides the accommodation portion 123 and the sealing portion 124. That is, since the fold lines 125 configured to guide positions at which the exterior materials 121 and 122 are folded are disposed such that at least one part thereof is located at an inner side of the accommodation portion 123 and is disposed to be parallel to at least one of longitudinal and width directions of the exterior materials 121 and 122, portions bent while parts of the sealing portion 124 are folded are always located at sides of the accommodation portion 123. Accordingly, when the first resin layers 121a and 122a forming the exterior materials are cured by an adhesive, an occurrence probability of a crack becomes very high. Accordingly, when the fold lines 125 are located on the sealing portion 124 in direct contact with the adhesive while folded, the first resin layers 121a and 122a are cured by the adhesive, and thus a crack occurs at a folded portion. Accordingly, an electrolyte accommodated in the accommodation portion 123 is leaked through the crack, the leaked electrolyte moves through the metal layers 121b or 122b stacked on the first resin layers 121a or 122b, and thus an electrical short circuit occurs. In the present invention, since the fold lines 125 are located on the accommodation portion 123 on which an adhesive is not disposed, the first resin layers 121a and 122a are prevented from being cured by the adhesive, and thus a risk that a crack may occur at the first resin layers 121a and 122a can be prevented.

Meanwhile, the electrode assembly 130 is encapsulated in the exterior materials 121 and 122 together with the electrolyte and includes a positive electrode 132 and a negative electrode 136 and a separator 134 as illustrated in FIG. 6.

The positive electrode 132 includes a positive electrode current collector 132a and a positive electrode active material 132b, the negative electrode 136 includes a negative electrode current collector 136a and a negative electrode active material 136b, and the positive electrode current collector 132a and the negative electrode current collector 136a may be formed in a plate sheet shape having a predetermined area. That is, in the positive electrode 132 and the negative electrode 136, one or both surfaces of each of the current collectors 132a and 136a may be pressed, deposited, or coated with the active material 132b or 136b. In this case, the active materials 132b and 136b may be respectively provided to correspond to entire areas of the collector 132a and 136a, or to correspond to parts of the areas thereof.

In addition, the positive electrode current collector 132a and the negative electrode current collector 136a may be formed with a negative electrode terminal 138 and a positive electrode terminal 139, respectively, so as to be electrically connected to an external device from bodies of the positive electrode current collector 132a and the negative electrode current collector 136a. Here, the positive electrode terminal 139 and the negative electrode terminal 138 may be provided to extend from the positive electrode current collector 132a and the negative electrode current collector 136a, respectively, and protrude from one side of the exterior material 121 and 122, or may be provided to be exposed from a surface of the exterior material 121 and 122.

In this case, in the present invention, the positive electrode active material 132b and the negative electrode active material 136b may include a polytetrafluoroethylene (PTFE) component. The reason is to prevent the positive electrode active material 132b and the negative electrode active material 136b from being separated from the current collectors 132a and 136a, respectively, or to prevent the occurrence of a crack when the flexible battery is bent.

Meanwhile, the separator 134 disposed between the positive electrode 132 and the negative electrode 136 may include a nanofiber web layer 134b formed on one or both surfaces of a non-woven fabric layer 134a. Here, the nanofiber web layer 134b may be nanofiber including one or more selected from among polyacrylonitrile nanofiber and polyvinylidene fluoride nanofiber. Preferably, the nanofiber web layer 134b may include only the polyacrylonitrile nanofiber for securing spinnability and uniform pore formation.

In addition, when a gel polymer electrolyte is used as an electrolyte, the separator 134 may be a composite porous separation membrane to optimize impregnability of the gel polymer electrolyte. That is, the composite porous separation membrane may include a porous non-woven fabric used as a matrix and having fine pores and a porous nanofiber web made of a spinnable polymer material and configured to be impregnated with an electrolyte.

Meanwhile, only a swelling polymer which swells in an electrolyte or a mixed polymer in which a heat resistant polymer capable of enhancing heat resistance is mixed with a swelling polymer may be used as the porous nanofiber web. Such a porous nanofiber web having a three-dimensional pore structure is made by a single or mixed polymer being dissolved in a solvent to form a spinning solution, the spinning solution being spun using an electrospinning device, and spun nanofibers being accumulated in a collector.

Here, any polymer, which is dissolved in a solvent to form a spinning solution and then spun by an electrospinning method to form nanofibers, may be used as the porous nanofiber web. For example, when a mixed polymer of a swelling polymer and a non-swelling polymer (or a heat resistant polymer) is used as the porous nanofiber web, the swelling polymer and the non-swelling polymer may be mixed in a weight ratio ranging from 9:1 to 1:9, preferably ranging from 8:2 to 5:5.

Generally, the non-swelling polymer is mainly the heat resistant polymer and also has a relatively high melting point because of a higher molecular weight than the swelling polymer. Accordingly, the non-swelling polymer is preferably a heat resistant polymer having a melting point of 180° C. or more, and the swelling polymer is preferably a resin having a melting point of 150° C. or less, preferably, in the range of 120 to 150° C.

Meanwhile, the non-woven fabric, which constitutes the non-woven fabric layer 13.4a, may use one or more materials selected from cellulose, cellulose acetate, polyvinyl alcohol (PVA), polyvinyl alcohol, polysulfone, polyimide, polyetherimide, polyamide, polyethylene oxide (PEO), polyethylene (PE), polypropylene (PP), polyethylene terephthalate (PET), polyurethane (PU), polymethyl methacrylate (PMMA), and polyacrylonitrile. Here, the non-woven fabric layer may further include an inorganic additive, and the inorganic additive may include one or more materials selected from $SiO$, $SnO$, $SnO_2$, $PbO_2$, $ZnO$, $P_2O_5$, $CuO$, $MoO$, $V_2O_5$, $B_2O_3$, $Si_3N_4$, $CeO_2$, $Mn_3O_4$, $Sn_2P_2O_7$, $Sn_2B_2O_5$, $Sn_2BPO_6$, $TiO_2$, $BaTiO_3$, $Li_2O$, $LiF$, $LiOH$, $Li_3N$, $BaO$, $Na_2O$, $Li_2CO_3$, $CaCO_3$, $LiA_1O_2$, $SiO_2$, $Al_2O_3$, and PTFE.

Meanwhile, although a generally used liquid electrolyte may be used as an electrolyte encapsulated in the accommodation portion together with the electrode assembly 130, a gel polymer electrolyte may be preferably used as the electrolyte. Thus, since the gel polymer electrolyte is used as an electrolyte of the flexible battery 120 or 220, liquid leakage and leakage occurrence, which may occur when a liquid electrolyte is used in the flexible battery and the flexible battery is bent, may be prevented. The gel polymer electrolyte may be made by gelation heat treatment being performed on an organic electrolyte solution including a nonaqueous organic solvent, a solute of a lithium salt, a monomer for forming a gel polymer, and a polymerization initiator. Such a gel polymer electrolyte may be made by heat treatment being performed on only the organic electrolyte, but may be made in a form in which a gel polymer in a gel state is impregnated in pores of the separator 134 by heat treatment being performed in a state in which the organic electrolyte is impregnated in the separator provided in the flexible battery, and the monomer being in-situ polymerized.

Meanwhile, the flexible battery 120 or 220 applied to the present invention may include insulating layers 121d and 122d for preventing heat generated by the flexible battery 120 or 220 from being transmitted toward the display body 110 or 210 during use (see FIG. 6). Such insulating layers 121d and 122d may be respectively provided on the surfaces of the exterior materials 121 and 122 forming the flexible battery 120 or 220, and may be respectively formed on the entire surfaces of the exterior materials 121 and 122 or may also be formed on one surface thereof adjacent to the display unit 111.

Thus, heat, which is generated by the flexible battery 120 or 220 while the display unit 111 is driven using power supplied by the flexible battery 120 or 220, can be prevented from affecting electronic components disposed adjacent to the flexible battery 120 or 220. Such insulating layers 121d and 122d may be may be provided as a thin film, and may include a known insulating member having heat resistance capable of maintaining a shape, for example, at 150° C. or more, preferably at 180° C. or more without limitation.

Meanwhile, although the insulating layers 121d and 122d are respectively provided on the surfaces of the exterior materials 121 and 122, the present invention is not limited thereto, and the insulating layers 121d and 122d may also be respectively provided on surfaces of the positive electrode terminal 139 and the negative electrode terminal 138 which protrude from the electrode assembly 130 toward the outside of the exterior materials, Meanwhile, in the rollable display device 100 or 200 according to the present invention, a supporting member 140 in a plate shape may be disposed on at least one surface of the flexible battery 120 or 220. Such a supporting member 140 is for supporting the flexible battery 120 or 220 to prevent the flexible battery 120 or 220 from being twisted in an oblique direction which is inclined at a predetermined angle with respect to a longitudinal direction thereof when the flexible battery 120 or 220 is rolled. That is, as the supporting member 140 prevents the flexible battery 120 or 220 from being twisted in a twisting direction in which there is no protection by the patterns 126 and 137, the flexible battery 120 or 220 is always protected by the patterns 126 and 137 formed on the flexible battery 120 or 220 when the flexible battery 120 or 220 is rolled.

Figure 4:
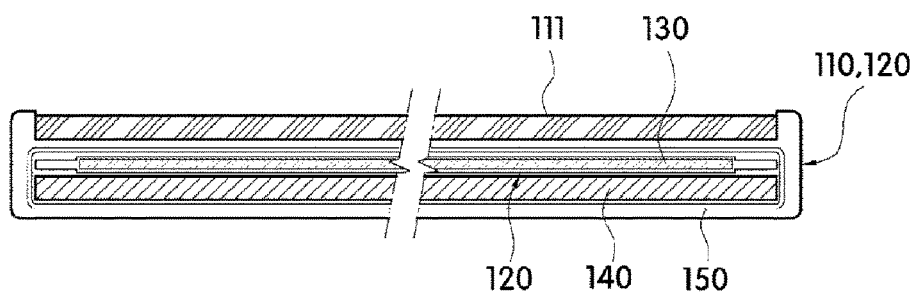
FIG. 4 is a schematic cross-sectional view illustrating the rollable display device according to the present invention.

To this end, the supporting member 140 is formed to have a suitable elastic force capable of allowing the display body 110 or 210 to be rolled, and the supporting member 140 is formed as a plate member having a predetermined area for covering one surface of the flexible battery 120 or 220. As illustrated in FIG. 4, such a supporting member 140 may be disposed to be in contact with at least one surface of the flexible battery 120 or 220, or as illustrated in FIGS. 19 and 20, may be disposed to be in contact with both surfaces of the flexible battery 120 or 220.

Thus, the rollable display device 100 or 200 according to the present invention can prevent the flexible battery 120 or 220 from being penetrated using the supporting member 140 having a plate shape even when struck by a sharp object such as a needle and an awl, or a corner of furniture, a household appliance, or the like. That is, the supporting member 140 is formed in a plate shape, is disposed on at least one surface or preferably on each of both surfaces of the flexible battery 120 or 220, and thus serves to protect the flexible battery 120 or 220 from an external environment. Here, when the supporting member 140 is provided on only one surface of the flexible battery 120 or 220, it is preferable for the supporting member 140 to be disposed at a side opposite the display unit 111 of the display body 110 or 210 with respect to the flexible battery 120 or 220.

Figure 19:
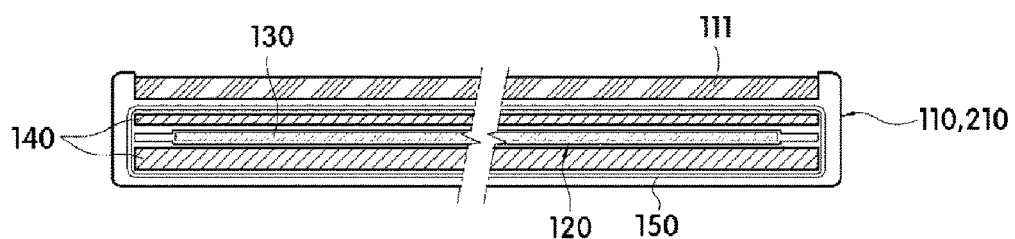
FIG. 19 is schematic view illustrating a case in which supporting members are disposed on both surfaces of the flexible battery in the rollable display device according to the present invention.
Figure 20:
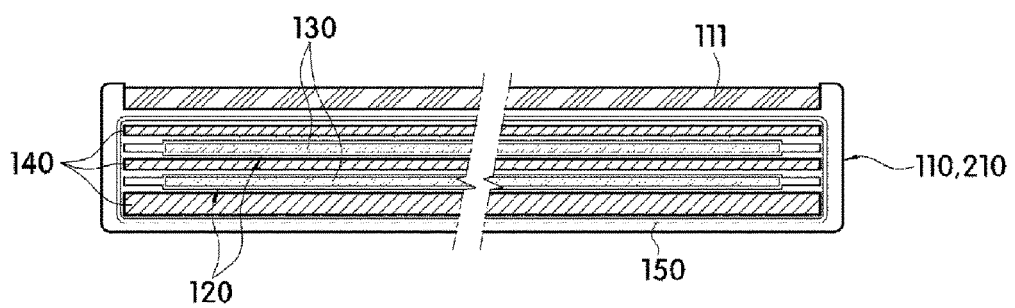
FIG. 20 is a schematic view illustrating a stacking relation between a plurality of flexible batteries and the supporting member when the plurality of flexible batteries are provided on the rollable display device according to the present invention.

In addition, when a pair of supporting members 140 are disposed on both surfaces of the flexible battery 120 or 220, the pair of supporting members 140 may be formed to have different thicknesses, a supporting member 140 disposed at an outermost side from the display unit 111 of the display body 110 or 210 may have a thickness which is greater than that of the supporting member 140 disposed at an inner side close to the display unit 111 of the display body 110 or 210 (see FIGS. 19 and 20). This is for preventing an elastic force from being excessively generated by the supporting member 140 disposed at both sides with respect to the flexible battery 120 or 220.

As described above, in the rollable display device 100 according to the present invention, since the flexible battery 120 or 220 disposed at one surface of the display body 110 or 210 is supported by the supporting member 140 formed in a plate shape and having an elastic force, the display body 110 or 210 and the flexible battery 120 or 220 is prevented from being twisted in a rolling direction when the display body 110 or 210 is rolled. Accordingly, as the flexible battery 120 or 220 is induced to be rolled in the same direction as that of the patterns 126 and 137 formed therein, the flexible battery 120 or 220 can be prevented from being damaged due to excessive rolling.

Figure 12:
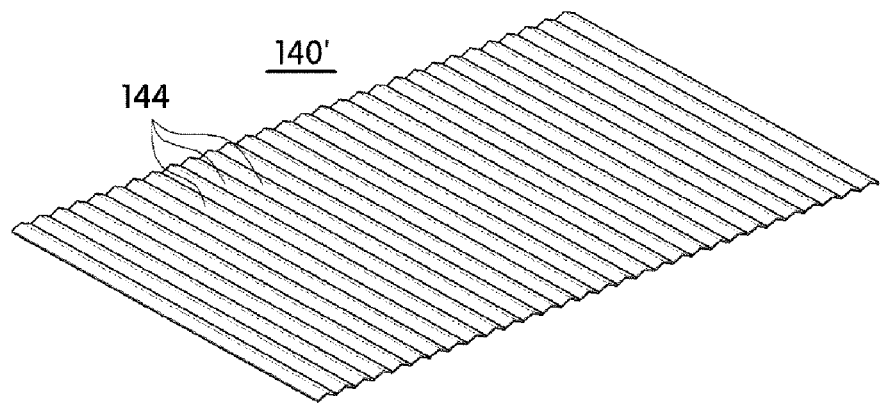
FIG. 12 is a view illustrating the supporting member applied to the rollable display device according to the present invention when a pattern is formed on the supporting member.

In this case, although the supporting member 140 may be formed as a plate member on which a pattern is not formed, the supporting member 140 may be provided to have a pattern 144 which is the same as the patterns 126 and 137 formed on the flexible battery 120 or 220 in a longitudinal direction, the pattern 144 formed on a supporting member 140' may be provided to be coincident with the patterns 126 and 137 formed on the flexible battery 120 or 220 as illustrated in FIG. 12. Here, the pattern 144 formed on the supporting member 140' may be formed on each of the both surfaces of the supporting member, or may also be provided on one surface in contact with the flexible battery 120 or 220.

Meanwhile, a plurality of flexible batteries identical to the flexible battery 120 or 220 may be stacked and disposed on one surface of the display body 110 or 210 to increase a total capacity thereof so as to further increase the use time of the rollable display device 200 (see FIG. 20). In this case, in the plurality of flexible batteries 120 or 220 which are vertically stacked, one flexible battery 120 or 220 may be directly stacked in a portion above another flexible battery 120 or 220, or the supporting member 140 may be inserted and interposed between the flexible batteries 120 or 220. Here, the plurality of flexible batteries 120 or 220, which are stacked, are electrically connected to the circuit unit 160 or the terminal 112 in series or in parallel.

Figure 10:
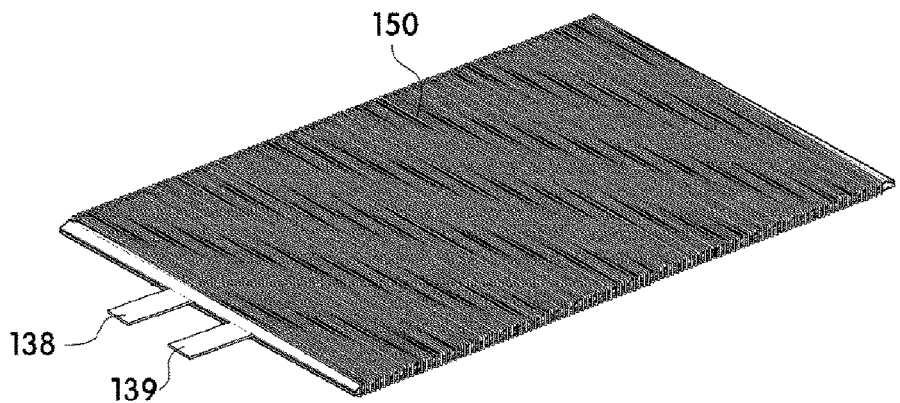
FIG. 10 is a view illustrating a state in which the flexible battery, a supporting member, and a wire material applied to the rollable display device according to the present invention are coupled.
Figure 11:
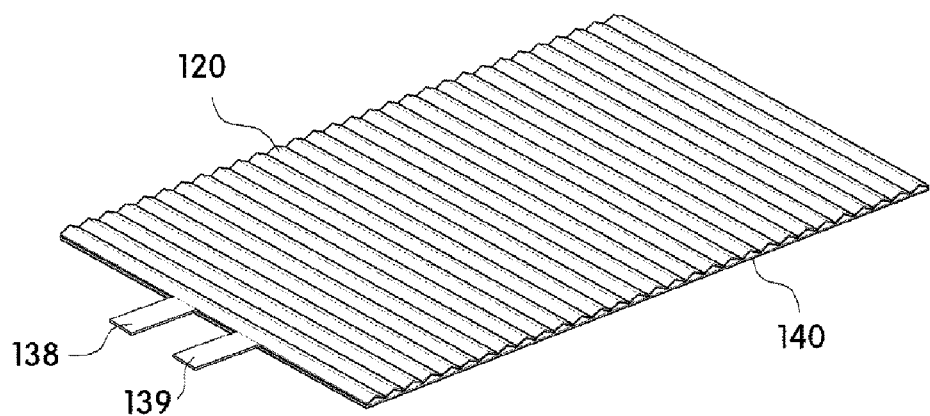
FIG. 11 is a view illustrating a state in which the wire material is removed from the state in FIG. 10.

Meanwhile, when the supporting member 140 is disposed on at least one surface of the flexible battery 120 or 220, the flexible battery 120 or 220 and the supporting member 140 may be fixed to each other by a wire material 150. That is, the wire material 150 is provided to cover the flexible battery 120 or 220 and the supporting member 140 as illustrated in FIGS. 4 and 10, and thus integrates the flexible battery 120 or 220 and the supporting member 140 without using a separate adhesive. Such a wire material 150 may be provided to correspond to a total length of the flexible battery 120 or 220 and the supporting member 140 or to correspond to a partial length thereof.

In this case, the wire material 150 includes a silver (Ag) nano-component, and may thus provide an excellent effect with respect to bacterial growth inhibition, sterilization, fungal growth inhibition, deodorization, blocking harmful radiation, and blocking electromagnetic waves to the flexible battery 120 or 220. That is, the wire material 150 may be made of pure silver having a purity of 89.99%, or may be a type of silver thread made of a silver alloy containing a metal such copper. However, the wire material 150 is not limited thereto, and the silver thread may be used alone, or a double and twisted yarn in which the silver thread is doubled and twisted with a metal or a nonmetal may be used as the wire material 150, and one strand or a plurality of strands thereof may be provided as the wire material 150.

Here, a silver nano-component may be included at 1 to 20 wt % of a total weight of the wire material 150. In addition, the silver nano-component may include one or more selected from among silver salts, nano silver, and silver ion exchangers. The silver salts may include one or more selected from among silver nitrate ($AgNO_3$), silver sulfate ($Ag_2NO_4$), and silver chloride (AgCl), and the silver salts may be included in the wire material 150 through a method generally used in a technical field of the present invention. The silver nano-material may include one or more selected from among a silver nanowire, a silver nanoparticle, a silver nanotube, and a silver nanocluster, and may preferably include a silver nanowire. The silver ion exchanger is a powder in which silver ions are exchanged in a zeolite, which is a porous exchanger, through a silver ion exchange method, and the silver ion exchanger may include one or more selected from among a silver zirconium phosphate, a silver zeolite, and a silver glass.

While embodiments of the present invention have been described above, the scope of the present invention is not limited thereto. It should be understood by those skilled in the art that various changes by addition, modification, deletion, and the like of components, may easily be made without departing from the spirit and the scope of the present invention and these are also included in the range of the scope of the present invention.

The invention claimed is:

1. A rollable display device comprising:
    a display body including a display unit configured to display various types of information as an image on one surface thereof and provided to be rollable;
    a flexible battery including an exterior material configured to encapsulate an electrode assembly together with an electrolyte and provided on the display body to supply power to the display body;
    a supporting member disposed on at least one surface of the flexible battery, wherein the supporting member is formed to have an elastic force and is formed as a plate member to cover one surface of the flexible battery,
    wherein the supporting member is configured to prevent the flexible battery and the display body from being twisted and to prevent the flexible battery from being penetrated when the display body is rolled,
    wherein the electrode assembly, the exterior material and the supporting member include patterns for shrinkage and relaxation when the display body and the flexible battery are rolled,
    wherein a pattern formed on the electrode assembly, a pattern formed on the exterior material and a pattern formed on the supporting member are disposed to be coincident with one another, wherein the supporting member and the flexible battery are fixed to each other by a wire material wrapped along a longitudinal direction.

2. The rollable display device of claim 1, further comprising a circuit unit electrically connected to the flexible battery,
    wherein the circuit unit includes a driving circuit configured to drive the display body and a communication circuit configured to perform wired and wireless communication with an external device.

3. The rollable display device of claim 2, wherein at least one first terminal for connecting with an external device is provided on one side of the display body.

4. The rollable display device of claim 1, wherein:
    a support bar around which the display body is rolled is provided on one end portion of the display body;
    a second terminal electrically connected with the flexible battery is provided on one side of the display body; and
    the support bar includes an accommodation groove configured to accommodate the second terminal.

5. The rollable display device of claim 4, wherein:
    a circuit unit including a driving circuit configured to drive the display body and a communication circuit configured to perform wired and wireless communication with an external device are embedded in the support bar; and
    the circuit unit is electrically connected with the display body and the flexible battery through the second terminal inserted into the accommodation groove.

6. The rollable display device of claim 5, wherein:
    at least one third terminal connected with an external device is provided on one side of the support bar; and
    the third terminal is electrically connected with the circuit unit.

7. The rollable display device of claim 1, wherein the wire material includes a silver (Ag) nano-component.

8. The rollable display device of claim 1, wherein:
    the pattern is provided such that a plurality of peak portions and a plurality of valley portions are alternately formed in the longitudinal direction, and the peak portion and the valley portion have an arc-shaped cross section, a polygonal cross section, or a combination thereof.

9. The rollable display device of claim 1, wherein the patterns are entirely or partially formed on the electrode assembly and the exterior material.

10. The rollable display device of claim 1, wherein:
    the electrode assembly includes a positive electrode and a negative electrode which are configured as a part or the entirety of a current collector is coated with an active material, and a separator which is disposed between the positive electrode and the negative electrode, and the separator includes a porous non-woven fabric layer which has fine pores, and a nanofiber web layer which contains polyacrylonitrile nano fibers on one surface or both surfaces of the non-woven fabric layer.

11. The rollable display device of claim 1, wherein the electrolyte includes a gel polymer electrolyte.

* * * * *